(12) United States Patent
Hendriks et al.

(10) Patent No.: US 8,063,429 B2
(45) Date of Patent: Nov. 22, 2011

(54) CONDUCTIVE SPACERS EXTENDED FLOATING GATES

(75) Inventors: Antonius Maria Petrus Johannes Hendriks, Gassel (NL); Josephus Franciscus Antonius Maria Guelen, Molenhoek (NL); Guido Jozef Maria Dormans, Bemmel (NL)

(73) Assignee: NXP B.V., Eindhoven (NL)

( * ) Notice: Subject to any disclaimer, the term of this patent is extended or adjusted under 35 U.S.C. 154(b) by 711 days.

(21) Appl. No.: 12/173,440

(22) Filed: Jul. 15, 2008

(65) Prior Publication Data

US 2008/0283899 A1 Nov. 20, 2008

Related U.S. Application Data

(62) Division of application No. 10/518,736, filed as application No. PCT/IB03/02738 on Jun. 12, 2003, now Pat. No. 7,416,939.

(30) Foreign Application Priority Data

Jun. 20, 2002 (EP) .................................... 02077452

(51) Int. Cl.
   *H01L 21/00* (2006.01)
(52) U.S. Cl. .................... 257/315; 257/316; 257/321
(58) Field of Classification Search .......... 257/315–316, 257/321
   See application file for complete search history.

(56) References Cited

U.S. PATENT DOCUMENTS

| | | | | |
|---|---|---|---|---|
| 5,879,990 | A * | 3/1999 | Dormans et al. | 438/257 |
| 6,069,033 | A * | 5/2000 | Verhaar et al. | 438/201 |
| 6,130,129 | A | 10/2000 | Chen | |
| 6,174,759 | B1 * | 1/2001 | Verhaar et al. | 438/201 |
| 6,323,516 | B1 * | 11/2001 | Wang et al. | 257/317 |
| 6,326,661 | B1 * | 12/2001 | Dormans et al. | 257/315 |
| 6,376,877 | B1 * | 4/2002 | Yu et al. | 257/317 |
| 6,413,809 | B2 * | 7/2002 | Nakamura et al. | 438/201 |
| 6,448,606 | B1 | 9/2002 | Yu et al. | |
| 6,518,619 | B2 * | 2/2003 | Verhaar et al. | 257/316 |
| 6,559,008 | B2 * | 5/2003 | Rabkin et al. | 438/257 |
| 6,562,681 | B2 * | 5/2003 | Tuan et al. | 438/257 |
| 6,566,196 | B1 | 5/2003 | Haselden et al. | |
| 6,570,215 | B2 * | 5/2003 | Tuan et al. | 257/315 |
| 6,583,009 | B1 | 6/2003 | Hui et al. | |
| 6,743,675 | B2 * | 6/2004 | Ding | 438/257 |
| 6,777,741 | B2 | 8/2004 | Rabkin et al. | |
| 6,791,142 | B2 | 9/2004 | Tseng | |
| 7,416,939 | B2 * | 8/2008 | Hendriks et al. | 438/257 |
| 2001/0030341 | A1 * | 10/2001 | Verhaar et al. | 257/315 |
| 2002/0130352 | A1 * | 9/2002 | Dormans et al. | 257/315 |
| 2002/0182807 | A1 * | 12/2002 | Dormans | 438/257 |
| 2005/0224860 | A1 * | 10/2005 | Hendriks et al. | 257/315 |
| 2007/0181914 | A1 * | 8/2007 | Uom et al. | 257/213 |
| 2008/0283899 | A1 * | 11/2008 | Hendriks et al. | 257/316 |
| 2009/0087976 | A1 * | 4/2009 | Hendriks et al. | 438/593 |
| 2009/0296447 | A1 * | 12/2009 | Verhaar et al. | 365/72 |

FOREIGN PATENT DOCUMENTS

DE 19840984 11/1999

* cited by examiner

*Primary Examiner* — Laura Menz

(57) ABSTRACT

A method for manufacturing on a substrate a semiconductor device with improved floating-gate to control-gate coupling ratio is described. The method comprises the steps of first forming an isolation zone in the substrate, thereafter forming the floating gate on the substrate, thereafter extending the floating gate using polysilicon spacers, and thereafter forming the control gate over the floating gate and the polysilicon spacers. Such a semiconductor device may be used in flash memory cells or EEPROMs.

7 Claims, 7 Drawing Sheets

CONDUCTIVE SPACERS EXTENDED FLOATING GATES

The present invention relates to a method for forming a floating gate (FG) extended with conductive spacers, usable for manufacturing of ultra high density non-volatile memories (NVM) as well as semiconductor devices using the extended floating gate. Some examples of NVMs include an EPROM, an EEPROM and a flash memory cell.

NVMs are used in a wide variety of commercial and military electronic devices and equipment, such as e.g. hand-held telephones, radios and digital cameras. The market for these electronic devices continues to demand devices with a lower voltage, lower power consumption and a decreased chip size.

Flash memories or flash memory cells comprise a MOSFET with a (or a plurality of) floating gate(s) between a control gate and a channel region, the floating gate(s) and the control gate being separated by a thin dielectric layer. With the improvement of fabrication technologies, the floating gate size and the space between floating gates has been reduced to sub-micrometer scale. These devices are basically miniature EEPROM cells in which electrons (or holes) are injected through an oxide barrier in a floating gate. Charges stored in the floating gate modify the device threshold voltage. In this way, data is stored. The control gate controls the floating gate. The floating-gate to control-gate coupling ratio, which is related to the areal overlap between the floating gate and the control gate, affects the read/write speed of the flash memory. Furthermore, the better the coupling ratio, the more the required operation voltage of the memory cell can be reduced.

Stacked gate technology is applied in the fabrication of modern non-volatile memory (NVM) cells with very high density, as shown in FIG. 1. In a stacked gate technology, the control gate (CG) 2 and the floating gate (FG) 4 are etched in a self-aligned manner in one and the same patterning step, resulting in zero overlap of the CG 2 over the FG 4 in the direction of the active area 6. This is shown in FIG. 2, which is a cross-section in the direction X-X' of one of the NVM cells represented in FIG. 1. FIG. 3 shows a cross-section in the direction Y-Y' of the NVM cell represented in FIG. 1. It is shown that FGs 4 are located apart from each other to assure isolation of the FGs 4 in the Y-Y' direction. This is achieved by etching FG slits 8 in the bottom polysilicon gate prior to depositing an interpoly dielectric (IPD) 10 and a CG polysilicon layer 12. The slits 8 can either be continuous lines or separated small slits. In both cases fence leakage occurs: with continuous slit lines, leakage is observed between FGs in the X-X' direction, and with separated slits, leakage is observed between FGs in the X-X' direction and in the Y-Y' direction.

The contribution of the potential on the CG, $V_{CG}$, to the potential on the FG, $V_{FG}$, in a non-volatile memory (NVM) cell, is determined by the FG to CG coupling ratio, $\alpha_{FC}$:

$$V_{FG} = \alpha_{FC} \times V_{CG}$$

The FG to CG coupling ratio is determined by:

$$\alpha_{FC} = C_{FC}/C_{tot}$$

where $C_{FC}$ if the capacitance between FG and CG, and $C_{tot}$ is the total capacitance of the FG.

In order to achieve maximum FG to CG coupling, the capacitance $C_{FC}$ between FG and CG must be maximized, and/or the total capacitance of the FG must be minimized.

One solution for improving the floating gate to control gate coupling ratio is to increase the dimensions of the floating gate, thus increasing the overlap area of the CG over the FG in the Y-Y' direction as in FIG. 1a, so as to increase the capacitance $C_{FC}$. This, however, limits the ability to reduce the cell size and thus impedes device density improvements. Maximum density requires minimum spaces between FGs, or thus minimum slits 8. Slit dimensions are limited by lithographic processes used in manufacturing the gate stacks.

It is known from U.S. Pat. No. 6,214,667 to make small slits by using nitride ($Si_3N_4$) spacers. In this technique, slits are etched in a (relative thick) nitride layer on top of the FGs. Next, nitride sidewall spacers are formed. The nitride layer including spacers functions as a hard mask for the FG slit etch. A disadvantage of this method is the removal of the nitride, for example with $H_3PO_4$ phosphoric acid that etches (especially doped) polysilicon. This requires a trade-off between leaving behind nitride residues and causing a rough FG surface. Both situations will lead to IPD reliability problems. Furthermore, sharp FG edges are obtained, reducing the IPD reliability still more.

Another method is basically used to prevent poor tunnel oxide edges. U.S. Pat. No. 6,130,129 describes how to increase the FG to CG coupling ratio by reducing the total FG capacitance. In this document this is achieved by applying self-aligned FGs revealing only a small overlap of the FG over the active area/substrate. This is done by etching trenches in the substrate self-aligned with the FGs. The trenches are filled up with an isolating oxide. This oxide reaches above the substrate surface covering a part of the FG polysilicon sidewalls. This causes some loss in the FG to CG capacitance. The spacers formed in U.S. Pat. No. 6,130,129 have only a limited height, reducing the FG to CG capacitance. When applied in a stacked gate technology, preventing fence leakage is difficult for these low spacers, as they contain only a minor part that is straight in a direction perpendicular to the substrate. Furthermore, the processing described is rather complex and difficult to embed in logic CMOS processes.

It is an object of the present invention to provide a method of forming a spacer-extended FG with an improved (higher) FG to CG coupling ratio, which is reliable and can be embedded in logic CMOS processes.

It is a further object of the present invention to provide a semiconductor device having a spacer-extended FG with an improved (higher) FG to CG coupling ratio, which is reliable and can be embedded in logic CMOS processes.

The present invention describes a conductive spacer-extended FG manufacturing method and device that offers the possibility to scale NVM cells towards deep sub-micron dimensions, while maintaining high reliability and FG to CG coupling.

The present invention provides a method for manufacturing on a substrate a semiconductor device with a floating gate (FG) and a control gate (CG). The method comprises the steps of: first forming isolation zones in the substrate, thereafter forming a floating gate on the substrate between two isolation zones, thereafter extending the floating gate using conductive spacers, and thereafter forming a control gate over the floating gate and the conductive spacers. The isolation zones may be shallow trench isolation (STI) zones, or locally oxidized semiconductor (LOCOS) regions.

With the method of the present invention, the overlapping area between the FG and the CG is increased without increase in the cell size, by a portion of the CG situated above the sidewall spacers. Furthermore, the distance between FGs can be shorter than the feature size, which is the size allowed by the underlying photolithography technology used. Therefore improved non-volatile memories such as flash memories can be manufactured with the method of the present invention, using currently available photolithography technology.

According to an embodiment of the present invention, the floating gate is formed by providing the floating gate on the substrate, the floating gate having two opposite walls located above the isolation zones, and forming a recess in the isolation zones under the opposite walls of the floating gate. This may be done by depositing a floating gate layer and forming slits in the floating gate layer, thus forming the opposite walls of the floating gate.

The step of extending the floating gate may comprise depositing a conductive layer on the opposite walls of the floating gate and on the walls of the recess in the isolation zones.

The step of depositing a conductive layer on the opposite walls of the floating gate and on the walls of the recesses in the isolation zones may comprise depositing a conductive layer over the floating gate and in the recesses in the isolation zones, and etching the conductive layer.

The method may further comprise a step of forming a dielectric layer on the floating gate and on the conductive spacers before forming the control gate.

The method may also comprise a step of providing a tunnel oxide between the semiconductor substrate and the floating gate.

A recess in an isolation zone may be formed by etching.

The step of forming the control gate may comprise the steps of depositing a control gate layer, and patterning the control gate layer to form the control gate.

The conductive spacers may be polysilicon spacers.

The present invention also provides a semiconductor device with a floating gate and a control gate. It comprises a substrate with a planar surface. Two isolation zones are present in the substrate in the planar surface. A floating gate having two side walls extending vertically with respect to the planar surface of the substrate is present on the substrate between two isolation zones, the walls having a height as measured from the planar surface. Conductive spacers extend the floating gate from each wall laterally with respect to the planar surface, and they extend vertically with respect to the planar surface at least over the height of the floating gate side walls. A control gate extends laterally with respect to the planar surface over the floating gate and the conductive spacers.

The conductive spacers furthermore extend vertically with respect to the planar surface over a supplementary height in a recess in the isolation zones. The supplementary height of the conductive spacers increases the effective coupling of the FG to the CG.

In an array of semiconductor devices according to the present invention, there may be a sub-lithographic slit between floating gates of adjacent semiconductor devices, i.e. a space in between adjacent floating gates which is smaller than the minimal dimensions defined by the lithographic process used. This enhances the floating gate to control gate coupling ratio.

The present invention also provides a non-volatile memory including a semiconductor device according to the present invention. The non-volatile memory may be a flash memory or EEPROM.

Figure 1:
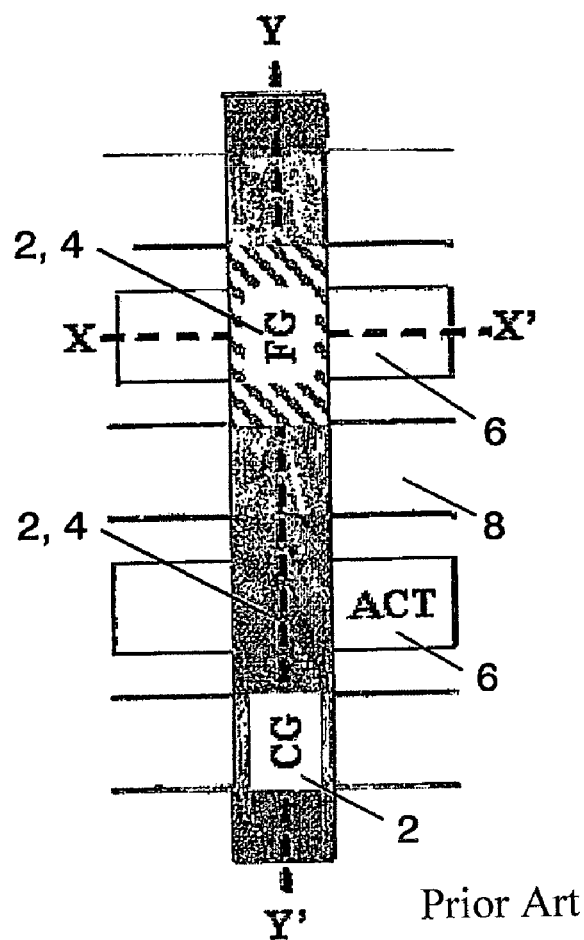
FIG. 1 shows a top view of a layout of a plurality of NVM cells according to the prior art, with the CG partly removed.
Figure 2:
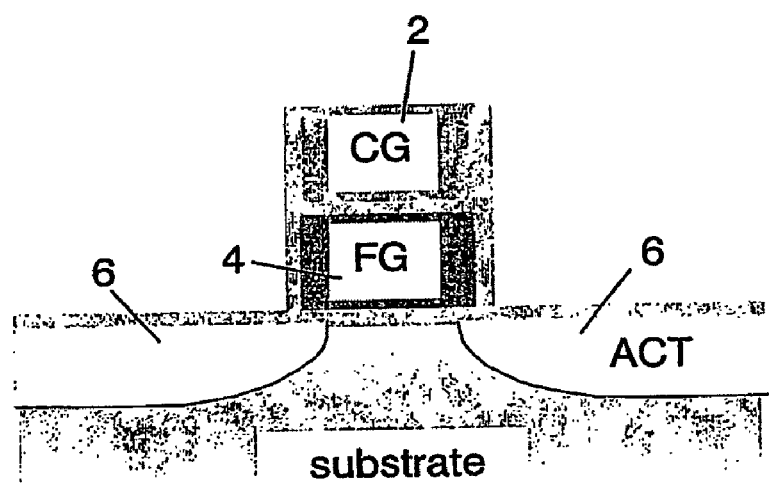
FIG. 2 shows a cross-section of a prior art NVM cell, according to line X-X' in FIG. 1.
Figure 3:
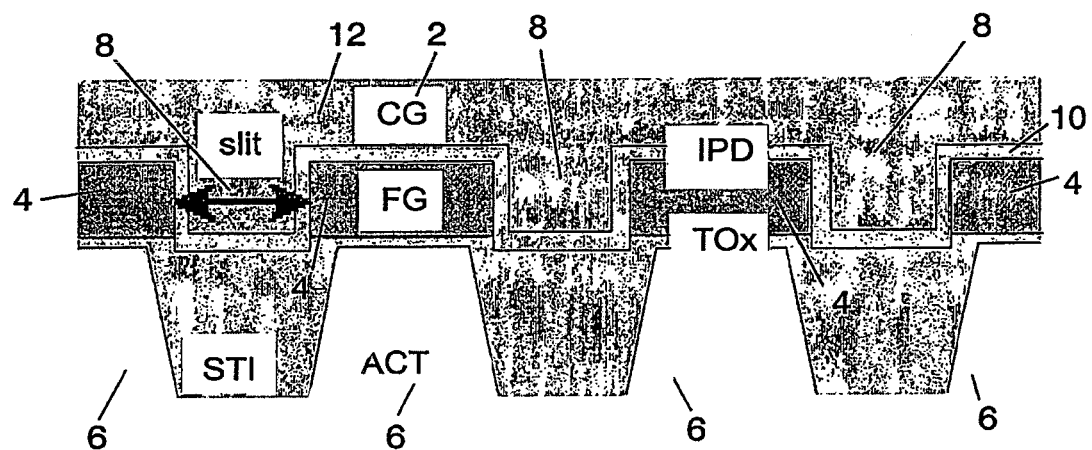
FIG. 3 shows a cross-section of a prior art NVM cell, according to line Y-Y' in FIG. 1.

The present invention will be described with reference to certain embodiments and drawings but the present invention is not limited thereto but only by the attached claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

According to the present invention, in a first step, a substrate 20 or a well in a substrate is provided. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. a doped silicon, a gallium arsenide (GaAs), a gallium arsenide phosphide (GaAsP), a germanium (Ge), or a silicon germanium (SiGe) substrate. The "substrate" may include for example, an insulating layer such as a $SiO_2$ or an $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. In the following processing will mainly be described with reference to silicon processing but the skilled person will appreciate that the present invention may be implemented based on other semiconductor material systems and that the skilled person can select suitable materials as equivalents of the dielectric and conductive materials described below.

Figure 4:
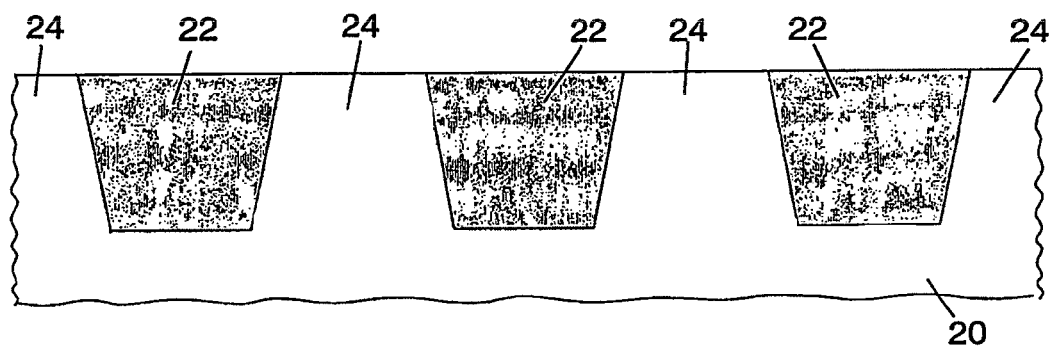
FIG. 4 is a cross-section of a substrate provided with isolation zones.

As shown in FIG. 4, in the Y-Y' direction (as defined in FIG. 1), this well or substrate 20 has a surface and is provided with shallow trench isolation (STI) zones 22 or thermally grown field oxide (LOCOS) regions, in order to isolate subsequent (as seen in the Y-Y' direction) memory cells from each other. Between two STI or LOCOS isolation zones 22, the remaining substrate 20 will form an active area 24.

STI isolation zones 22 may be formed by initially creating a shallow trench in semiconductor substrate 20, e.g. by a conventional photolithographic and anisotropic dry etch process such as a reactive ion etching (RIE) using e.g. $Cl_2$ as etchant. The shallow trench is created to a depth of for example between about 200 to 600 nm in the semiconductor substrate 20. After removal of the photoresist pattern, used for shallow trench definition, by plasma oxygen ashing and careful wet cleans, a silicon oxide layer is deposited, for example by a low pressure chemical vapor deposition (LPCVD) procedures or by a plasma enhanced chemical vapor deposition (PECVD) procedure, to a thickness between about 300 to 1500 nm. The shallow trenches are thus completely filled. Removal of the silicon oxide from regions other than inside the shallow trenches is accomplished using either a chemical mechanical polishing (CMP) procedure, or via a RIE procedure using a suitable etchant, resulting in insulator filled STI regions 22.

If instead of STI zones 22, LOCOS regions are used, they may be formed via initially forming an oxidation resistant mask, such as silicon nitride, then exposing regions of the semiconductor substrate not protected by the silicon nitride masking pattern, to a thermal oxidation procedure. LOCOS regions are thus created at a thickness equal to the depth of STI regions. After formation of the LOCOS region, the oxidation resistant mask is removed.

STI zones are preferred over LOCOS regions as they can be formed in a smaller dimension than that of the LOCOS regions, which allows the reduction of the cell dimensions, so that cell density can be increased. Therefore, in the following description, only STI zones are further considered, but it should be understood that the present invention includes the process steps described below carried out with LOCOS regions.

Figure 5:
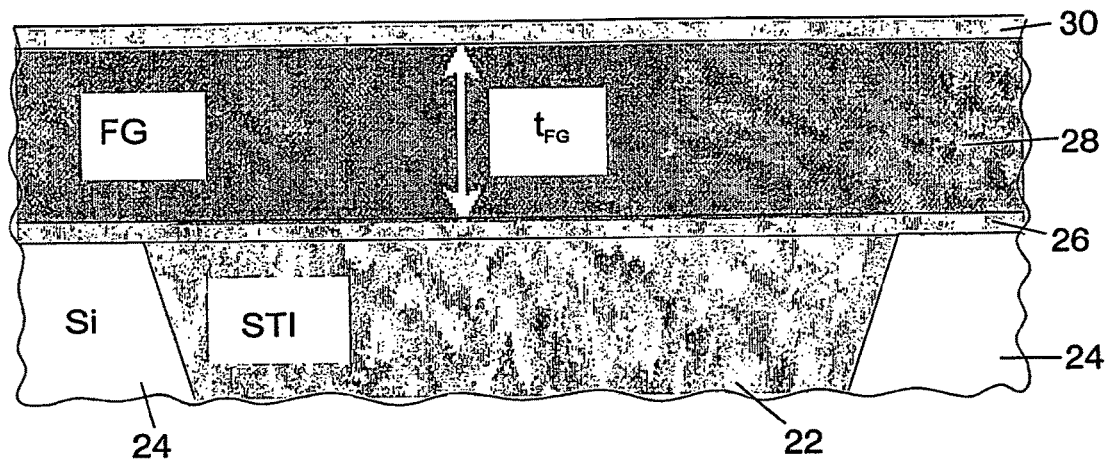
FIG. 5 is a cross-section after FG polysilicon and stopping layer deposition.

As shown in FIG. 5, on top of the substrate 20 provided with STI zones 22, a tunnel oxide (Tox) layer 26, comprising silicon dioxide, is formed, preferably by thermally growing it in an oxygen-steam ambient, at a temperature between about 600 to 1000° C., to a thickness between about 6 to 15 nm. Alternatively Rapid Thermal Oxidation (RTO) with in-situ steam generation (ISSG) can be used to obtain the tunnel oxide layer 26.

On top of the tunnel oxide 26, a first polysilicon layer 28 with thickness $t_{FG}$ is deposited, which will later on form the FG. The deposition of the first polysilicon layer is preferably done by a CVD procedure, to a thickness between about 50 to 400 nm. Doping of the polysilicon layer 28 is either accomplished in situ, during deposition, e.g. via the addition of arsine or phosphine to a silane ambient, or via an ion implantation procedure, using for example arsenic, phosphorous or boron ions applied to an intrinsic polysilicon layer.

On top of the first polysilicon layer 28, a stopping layer 30 is deposited, for example consisting of an insulating layer such as $SiO_2$.

This is shown in FIG. 5. The stopping layer 30 functions as stopping layer for a subsequent spacer etching step, and as screening layer for possible FG implantations.

Figure 6:
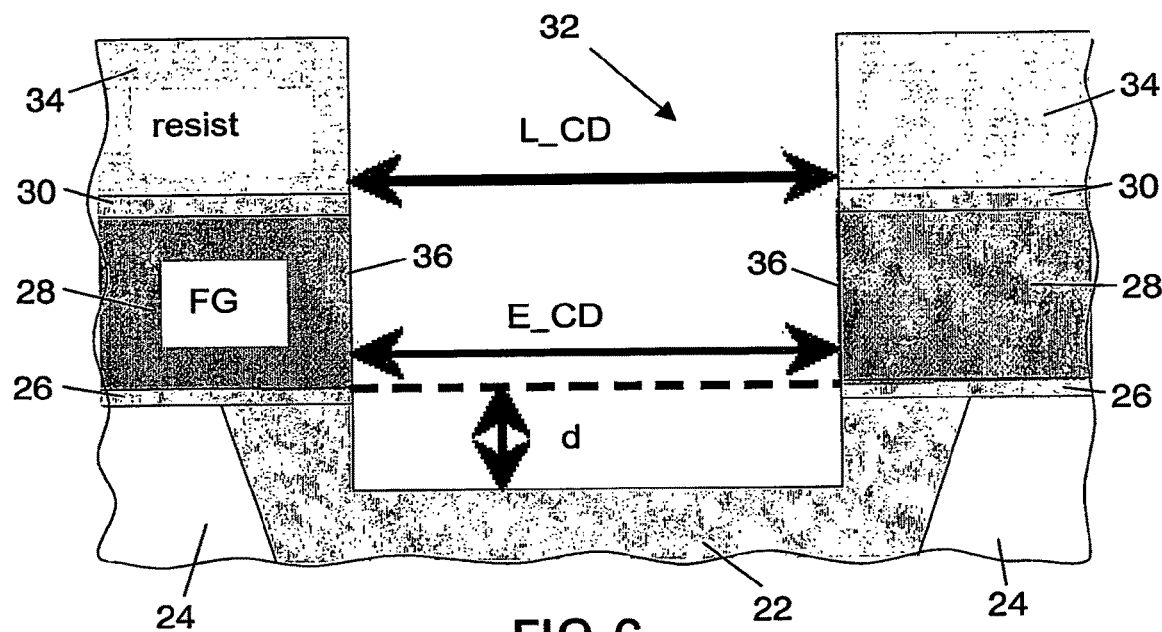
FIG. 6 is a cross-section after FG slit etch prior to resist strip.

FG slits 32 are patterned by a common exposure step. A resist layer 34 is applied on top of the stopping layer 30 and some parts thereof (depending on the desired pattern) are exposed. Subsequently, the non-exposed parts (or the exposed parts, depending on the kind of resist used) are washed away, leaving behind a certain pattern of resist, allowing layers not covered by the remaining resist layer to be etched away. The etch comprises a breakthrough (BT) step to etch through the stopping layer 30, followed by a polysilicon main etch through the first polysilicon layer 28, stopping on the STI 22. Next an oxide etch is performed forming a recess with depth d in the STI 22. This is shown in FIG. 6. FIG. 6 shows the situation after the oxide etch. The situation represented refers to the case with zero etch bias (and thus with edges perpendicular to the substrate surface). The etch bias is defined by:

$$\text{etch bias} = L\_CD - E\_CD.$$

Before removing the remainder of the resist layer 34, possible polymers and native oxide is removed from the FG sidewalls 36. Next the resist 34 is removed, e.g. via plasma oxygen ashing and careful wet cleans, leaving behind the stopping layer 30.

Figure 7:
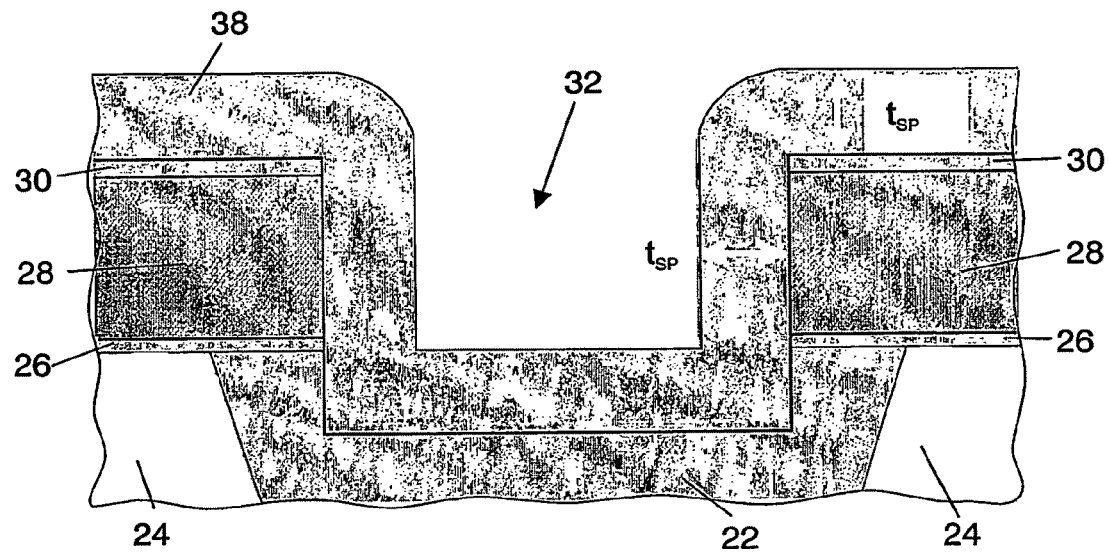
FIG. 7 is a cross-section of FG slit after resist strip and additional polysilicon layer deposition.

Preferably in a time critical sequence avoiding re-oxidation of FG sidewalls 36, succeeding a pre-clean, an additional polysilicon layer 38 with thickness $t_{SP}$ is deposited, as shown in FIG. 7, over the stopping layer 30 and in the slit 32. Preferably the polysilicon layer 38 is in-situ doped with the same dopant as the first polysilicon layer 28.

Figure 8:
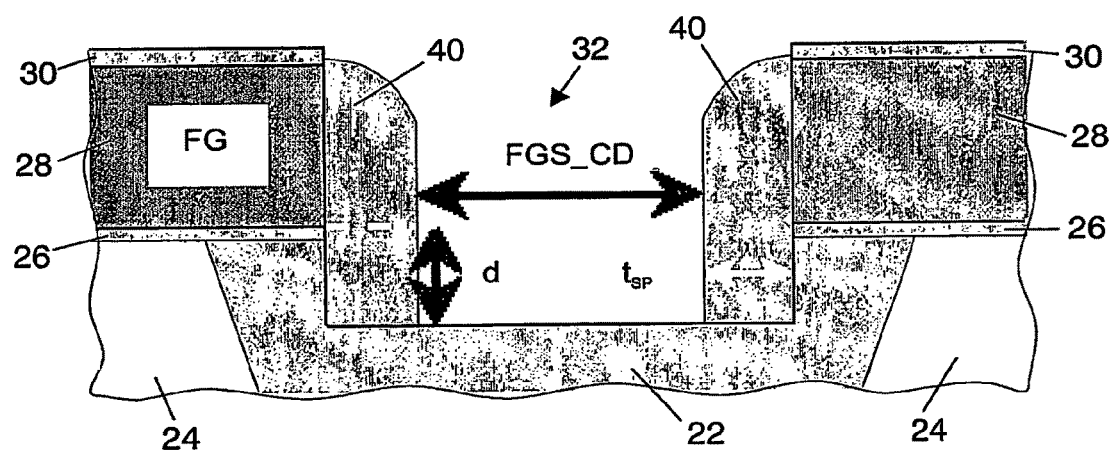
FIG. 8 is a cross-section of FG slit after polysilicon spacer etch. Polysilicon spacers form extensions of the FGs.

Thereafter, polysilicon spacers 40 are anisotropically etched, using the stopping layer 30 and STI 22 for end point detection of the main etch. The polysilicon spacers 40 will function as extensions of the FGs, thus narrowing the FG slit 32, as shown in FIG. 8. The dimensions L_CD, etch bias, E_CD and $t_{SP}$ determine the final critical dimensions (CD) of the slit (FGS_CD):

$$E\_CD = L\_CD - \text{etch bias}$$

$$FGS\_CD = E\_CD - 2 * t_{SP} = L\_CD - \text{etch bias} - 2 * t_{SP}$$

Figure 9:
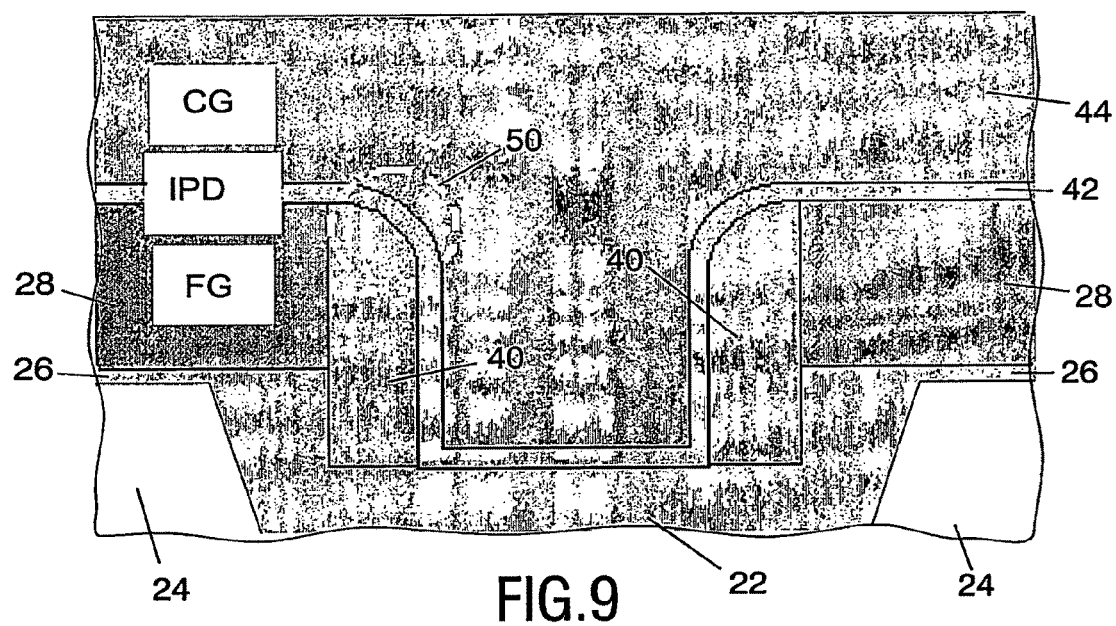
FIG. 9 is a cross-section of FG slit after IPD and CG polysilicon deposition.

After removing the stopping layer 30, an interpoly dielectric (IPD) 42 is formed, see FIG. 9. The IPD 42 preferably comprises a plurality of insulating materials, e.g. an Oxide Nitride Oxide (ONO) layer, and may be formed or grown by conventional techniques. An ONO layer preferably comprises successive layers of silicon dioxide, silicon nitride and silicon dioxide. The total dielectric thickness of the ONO layer generally is between about 10 to 50 nm.

After forming the IPD layer 42, CG polysilicon 44 is deposited (preferably in situ doped), as shown in FIG. 9. The deposition of the CG polysilicon layer 44 may be done by LPCVD procedures, to a thickness between about 50 to 400 nm. Doping of the CG polysilicon layer 44 is either accomplished in situ, during deposition, via the addition of a suitable dopant impurity such as arsine or phosphine to a silane ambient, or via an ion implantation procedure, using such a dopant, e.g. arsenic, phosphorous or boron ions applied to an intrinsically polysilicon layer.

In a last step in the formation of a NVM according to the present invention, CGs are etched (not shown in the drawings).

Cell formation is finalized with processing as known by a person skilled in the art (e.g. source/drain formation, salicidation, etc.).

Preferably, the following parameters are optimized when implementing spacers 40 for extending FGs in a process according to the present invention:

FG thickness $t_{FG}$: the larger the FG thickness $t_{FG}$ (i.e. the higher the FG), the more overlap area between FG and CG is created, and thus the larger the capacitance $C_{FC}$ between FG and CG will be.

L_CD: the smaller L_CD, the smaller the width of the slit 32, the higher the FG to CG coupling ratio. L_CD is limited by photo-lithographic means.

Figure 15:
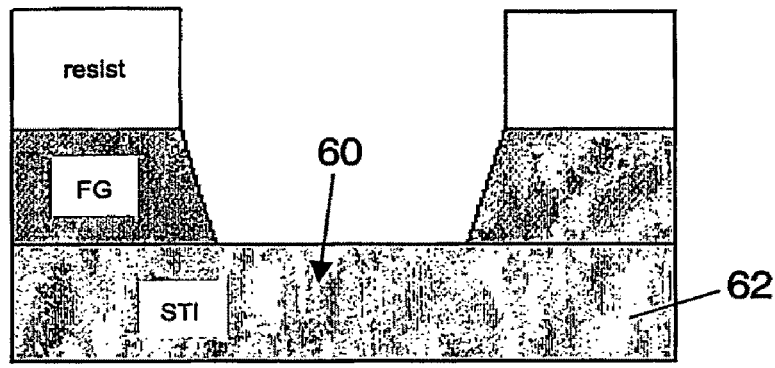
FIG. 15 shows a cross-section of a prior art NVM cell after poor FG slit etch (no straight part), according to line Ys-Ys' in FIG. 1.
Figure 16:
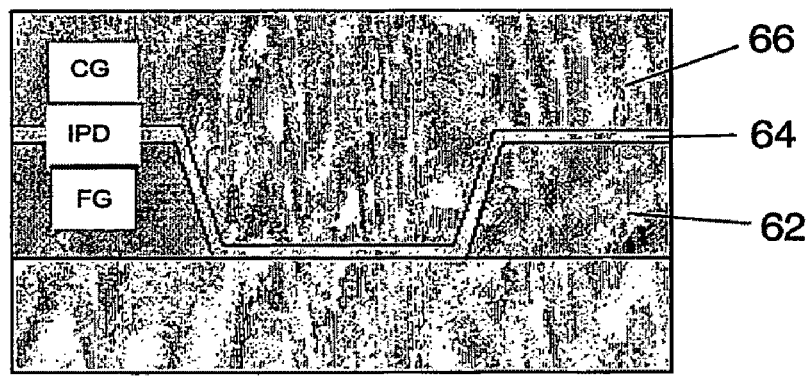
FIG. 16 shows a cross-section of a prior art NVM cell after IPD and CG polysilicon deposition, according to line Ys-Ys' in FIG. 1.
Figure 17:
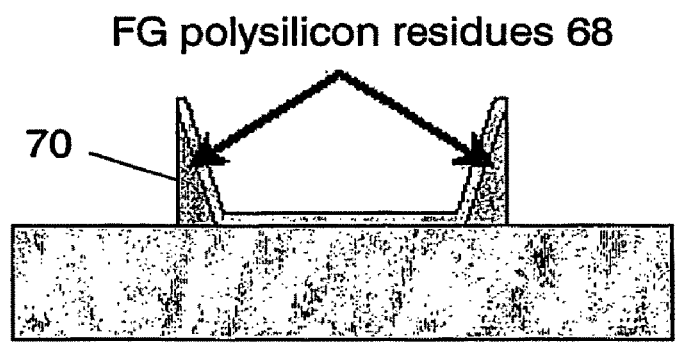
FIG. 17 shows a cross-section of a prior art NVM cell after CG etch, according to line Ys-Ys' in FIG. 1.

E_CD: The larger E_CD, i.e. the more the bottom part of the FG is etched straight, the less fence leakage will occur. Remaining fences, consisting of IPD (e.g. ONO), occur due to the IPD deposition after etching slits in the FG polysilicon and succeeding CG patterning. When the profile of the slits 60 etched in the first polysilicon layer 62 is sloped or shows irregularities (as shown in FIG. 15), then after IPD 64 formation and CG polysilicon 66 deposition (as shown in FIG. 16), IPD fences will mask the first polysilicon layer 62 during CG patterning. This causes polysilicon residues 68 next to the IPD fences 70, as shown in FIG. 17. These residues 68 short-circuit the FGs, causing leakage and lowering the circuit yield. Fence leakage can be prevented by etching the bottom part of the FG extremely straight and perpendicular at the STI zone (>85° angle with STI).

Thickness of the additional polysilicon layer for forming the spacer, $t_{SP}$: the thicker the polysilicon layer forming the spacers 40, the smaller the width of the slit 32, and the higher the FG to CG coupling ratio.

Depth d of the recess: the deeper the recess, the larger the FG to CG overlap area can be.

Figure 10:
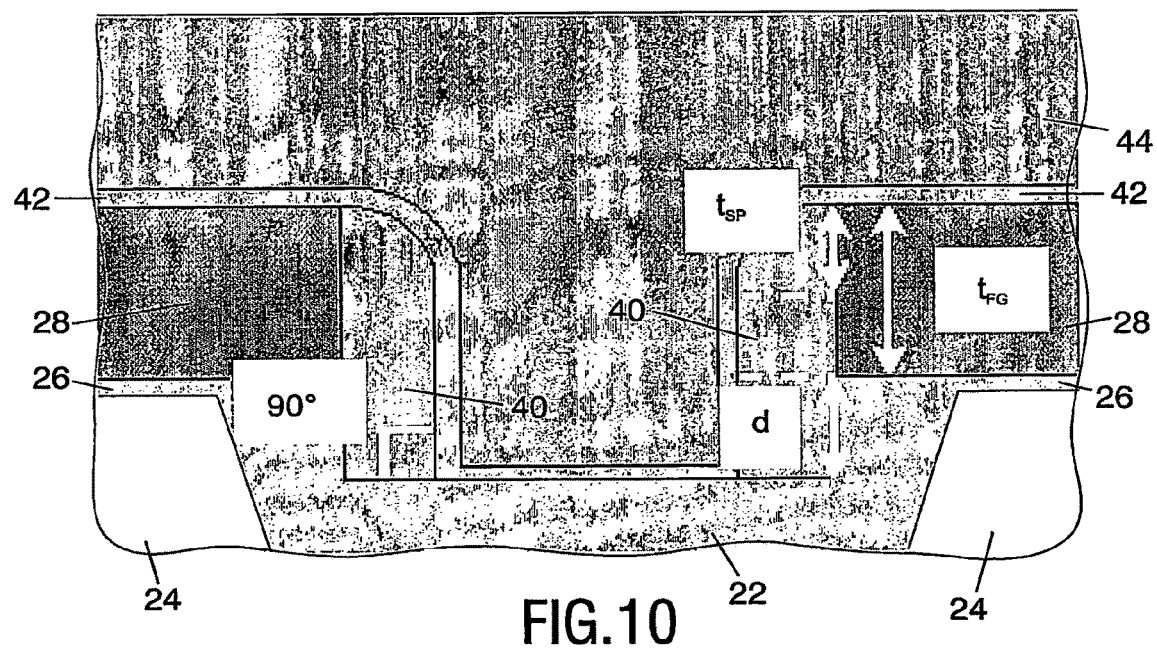
FIG. 10 is a cross-section as in FIG. 9, showing dimensions of different parts.
Figure 11:
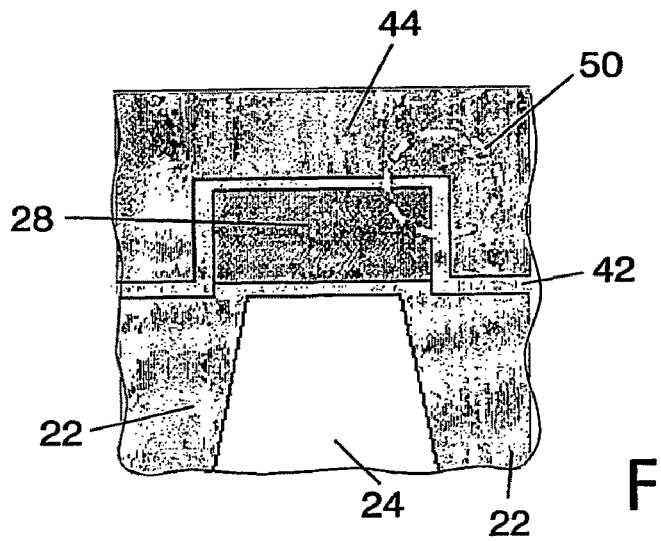
FIG. 11 shows a general FG/IPD/CG stack.

The height of the straight part of the FG is important as it determines the risk of fence leakage. The height of the straight part of the FG (perpendicular at STI) equals (see FIG. 10):

$$t_{FG} - t_{SP} + d$$

The spacers extended FG approach of the present invention has the following advantages:

It is well compatible with common (embedded) NVM processes. No additional masks are required.

A high packing density is feasible due to deep sub-micron slits (thus a small FG to FG distance) without reducing the litho and etch process window. Slit sizes are smaller than possible with currently available lithographic processes.

High FG to CG coupling ratios are feasible due to small slits (small FG to FG distance).

Figure 12:
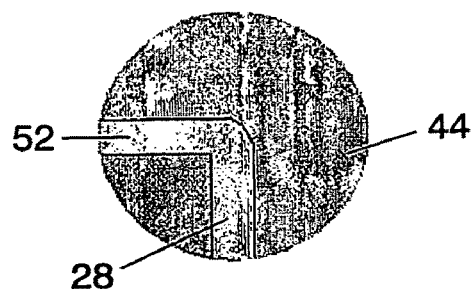
FIG. 12 illustrates a detail of FIG. 11, the IPD being formed by a deposited bottom oxide.
Figure 13:
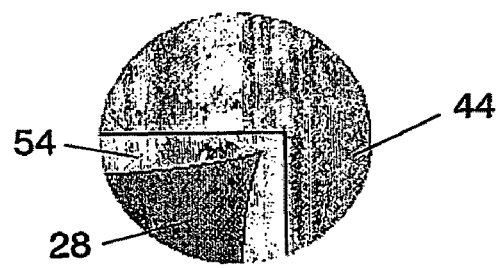
FIG. 13 illustrates a detail of FIG. 11, the IPD being formed by a furnace oxidized bottom oxide.
Figure 14:
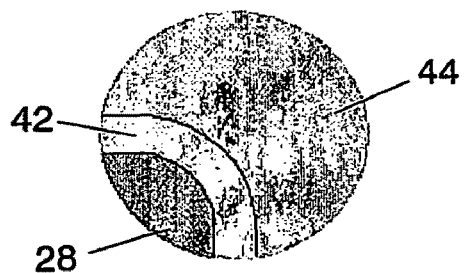
FIG. 14 illustrates a detail of FIG. 11, where the IPD is formed on a spacers extended FG.

Electric fields over the IPD 42 are considerably lower for a spacers extended FG approach of the present invention than for prior art devices, as no sharp edges occur where field lines are dense. This is illustrated in FIGS. 11 to 14. The circle 50 in FIG. 11 (corresponding to the circle 50 in FIG. 9) indicates which FG edge is considered in a FG/IPD/CG stack, and FIG. 12 to FIG. 14 show different possibilities for FG edges. FIG. 12 illustrates an IPD layer 52 in case the bottom oxide layer is deposited. There is a perfect step coverage, but there are sharp FG edges causing field enhancement. FIG. 13 shows an IPD layer 54 in case the bottom oxide is furnace oxidized. In this case, sharpening strongly depends on the oxidation conditions (temperature, time, ambient): dry is bad, wet is worse and rapid thermal oxidation (RTO) is best. FIG. 14 shows an oxide layer 42 in case of a spacers extended FG according to the present invention. This solution enhances reliability of the IPD 42 (breakdown probability is less) and data retention of the NVMs. Applying a spacers extended FG approach according to the present invention prevents IPD sharpening/thinning at the FG edges in case that part of the IPD is grown in a furnace.

Fence leakage (leakage from FG to FG via residues next to ONO fences) can be completely prevented, thus causing a high yield.

When applying manufacturable photo and etch processes, the final critical dimension of the FG slit 32 is determined by the thickness of a polysilicon layer 38 and is therefore very accurately controlled. Etching the polysilicon spacer 40 using an end point system is manufacturable. The control of the critical dimension of the deep sub-micron FG slits 32 is therefore no longer dependent on the FG slit photo and etch process but mainly depends on the control of the thickness of the polysilicon layer 38.

The invention claimed is:

1. Semiconductor device with a floating-gate to control-gate coupling ratio, comprising:
    a substrate with a planar surface,
    two isolation zones in the substrate in the planar surface,
    a floating gate on the substrate between two isolation zones, the floating gate having two side walls extending vertically with respect to the planar surface of the substrate, the walls having a height as measured from the planar surface,
    conductive spacers extending the floating gate from each wall laterally with respect to the planar surface, the conductive spacers extending vertically with respect to the planar surface at least greater than the height of the floating gate side walls to create an overlap configured and arranged to prevent fence leakage, and
    a control gate extending laterally with respect to the planar surface over the floating gate and the conductive spacers.

2. Semiconductor device according to claim 1, wherein the conductive spacers furthermore extend vertically with respect to the planar surface from a recess of the substrate.

3. An array of semiconductor devices of claim 1, wherein there is a sub-lithographic slit between floating gates of adjacent semiconductor devices.

4. A non-volatile memory including the semiconductor device according to claim 1.

5. The non-volatile memory according to claim 4, wherein the memory is a flash memory.

6. The non-volatile memory according to claim 4, wherein the memory is an EEPROM.

7. Semiconductor device of claim 1, wherein the bottom of the floating gate is substantially perpendicular to the isolation zones, the perpendicular bottom of the floating gate configured and arranged to prevent fence leakage.

* * * * *